US006809289B2

(12) United States Patent
Yung et al.

(10) Patent No.: US 6,809,289 B2
(45) Date of Patent: Oct. 26, 2004

(54) METHOD OF DRILLING A CIRCUIT BOARD

(75) Inventors: Kam-Chuen Yung, Hong Kong (CN); Tai-Man Yue, Hong Kong (CN); Xiang-Yi Fang, Hong Kong (CN)

(73) Assignee: The Hong Kong Polytechnic University, Kowloon (HK)

( * ) Notice: Subject to any disclaimer, the term of this patent is extended or adjusted under 35 U.S.C. 154(b) by 0 days.

(21) Appl. No.: 10/382,175

(22) Filed: Mar. 5, 2003

(65) Prior Publication Data

US 2004/0173589 A1 Sep. 9, 2004

(51) Int. Cl.[7] .................. B23K 26/38; B23K 26/40; B29C 35/08
(52) U.S. Cl. .................. 219/121.71; 216/65
(58) Field of Search .............. 219/121.61, 121.62, 219/121.67–121.72, 121.85; 216/13, 39, 65; 174/262, 266; 264/400; 205/78

(56) References Cited

U.S. PATENT DOCUMENTS

| | | | | |
|---|---|---|---|---|
| 5,093,279 A | * | 3/1992 | Andreshak et al. | ......... 438/662 |
| 5,614,114 A | | 3/1997 | Owen | |
| 6,211,485 B1 | * | 4/2001 | Burgess | ............. 219/121.7 |
| 6,631,558 B2 | * | 10/2003 | Burgess | ................... 29/852 |
| 6,657,159 B2 | * | 12/2003 | McKee et al. | ........ 219/121.71 |

\* cited by examiner

*Primary Examiner*—Samuel M. Heinrich
(74) *Attorney, Agent, or Firm*—Jackson Walker LLP

(57) ABSTRACT

A circuit board comprising a dielectric material provided with a conductive layer is drilled with laser operated at an energy density below the ablation threshold of the conductive layer. The method of drilling includes providing on the conductive layer an ablation layer having an ablation threshold near or below that laser energy density, directing the laser at a target area of the ablation layer to ablate portions of the conductive and dielectric layers in the target area, and removing any remaining ablation layer from the conductive layer.

10 Claims, 3 Drawing Sheets

METHOD OF DRILLING A CIRCUIT BOARD

BACKGROUND TO THE INVENTION

1. Field of the Invention

The invention relates to methods of drilling a circuit board, and in particular to drilling a printed circuit board with a laser operated at an energy density below the ablation threshold of a conductive layer on the circuit board.

2. Background Information

Microvia formation has become a key factor in high density printed circuit board (PCB) and printed wiring board (PWB) is fabrication, especially for increasingly sophistic electronics such as light, portable system and high density integrate circuits. Most advanced PCBs and PWBs are multi-layered and require a lot of metallized holes to interconnect conductors in different layers. Mechanical drilling techniques have many disadvantages and Laser drilling has become popular because of its superior features. Several different types of lasers are used for hole drilling including $CO_2$, YAG/UV, and excimer lasers. $CO_2$ lasers operate at a wavelength of 9.3–10.6 micrometers. Typical resins used in the dielectric layer of circuit boards have a high absorption threshold at this wavelength. However, the copper conductive layer has a very low absorption threshold (circa 1%) at this wavelength. Therefore, $CO_2$ lasers are suitable for drilling holes in the resin substrate, but the top copper layer will reflect most (circa 99%) of the laser. Currently, a two step process is used. Firstly, a hole is produced in the copper conductor layer with photolithography and etching methods similar to those used in semiconductor manufacture, and then the hole in the resin is drilled using a $CO_2$ laser.

On the other hand, a frequency-tripled YAG laser operating is at 355 nm can be used for drilling the hole in both the copper conductor and dielectric layers. However, this requires a spiral drilling process, which limits production efficiency.

Excimer lasers are also useful for drilling both the copper conductor and dielectric layers. However, they are not widely used in PCB manufacture because of their expense.

SUMMARY OF THE INVENTION

It is an object of the present invention to provide a method of laser drilling a circuit board in which the laser is operated at an energy density below the ablation threshold of a conductive layer of the board.

According to a first aspect of the invention there is provided a method of drilling a circuit board comprising a dielectric material provided with a conductive layer having an ablation threshold, and in which the laser is operated at an energy density below the ablation threshold, the method including:

providing on the conductive layer a ablation layer having an ablation threshold near or below that laser energy density, directing the laser at a target area of the ablation layer to ablate portions of the conductive and dielectric layers in the target area, and removing any remaining ablation layer from the conductive layer Preferably, the laser is a $CO_2$ laser operated at a wavelength of 9 to 11 micrometers.

Preferably, the ablation layer is metal.
Preferably, the ablation layer is Tin.
Preferably, the ablation layer is 3 micrometers thick.
Preferably, the ablation layer is provided on the conductive layer by electroplating.

According to a second aspect of the invention there is provided a method of drilling a circuit board using a $CO_2$ laser operating at a wavelength of between 9 to 11 micrometers, in which the circuit board comprises a dielectric material provided with a copper layer, the method including:

providing a metal layer on the copper layer, directing the laser at a target area of the metal layer to ablate portions of the copper and dielectric layers in the target area, and removing any remaining metal layer from the copper layer.

Preferably, the metal layer is Tin.
Preferably, the metal layer is 3 micrometers thick.
Preferably, the metal layer is provided on the conductive layer by electroplating.

Further aspects of the invention will become apparent from the following description, which is given by way of example only.

BRIEF DESCRIPTION OF THE DRAWINGS

Embodiments of the invention will now be described with reference to the accompanying drawings in which.

DESCRIPTION OF THE PREFERRED EXAMPLE

Figure 1:
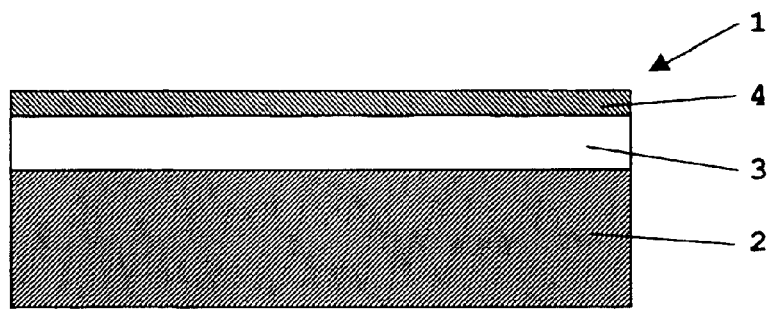
FIG. 1 is a schematic of a circuit board with an ablation layer according a method of the invention.

Referring to FIG. 1, in a preferred example of the invention a $CO_2$ laser operated at between 9.6 and 10.3 micrometers ($\mu$m) is used to drill a circuit board 1 (Printed Circuit Board or Printed Wire Board) comprising a dielectric material 2 provided with a 9 micrometer thick conductive copper layer 3. A suitable laser drilling devise for this is the ML605GTX2 $CO_2$ Laser Processing System made by Mitsubishi.

The ablation threshold of the copper layer 3 is well above the energy density of the $CO_2$ laser and most (circa 99%) of the laser will be reflected off the copper layer 3. To is overcome this problem the copper layer 3 is modified to reduce its absorption threshold to near or below the energy density of the laser. The copper layer 3 is modified by electroplating a 3 micrometer thick Tin (Sn) layer 4 onto it. In the preferred example the Tin is electroplated over the whole Copper layer 3. In an alternative example the Tin forms a plast on the copper layer 3 in target areas for the laser drilling.

The Tin (Sn) layer 4 is coated on the copper 3 without any surface treatment by a general electroplating method using commercial Sn plating liquid. The electroplating process parameters are given in the following table.

| Compound | Concentration |
| --- | --- |
| $SnSO_4$ | 70 (ml/L) |
| $H_2SO_4$ | 150 (ml/L) |
| Ronastan EC Part A | 80 (ml/L) |
| Ronastan EC Part B | 80 (ml/L) |
| Energy (J) | 0.005 (mA/cm$^2$) |

-continued

| Compound | Concentration |
| --- | --- |
| Temperature (T) | 25 (° C.) |
| Time (t) | 2, 3, 4, 5 (minutes) |

The Tin has an ablation threshold near or below the laser energy density and absorbs the laser energy. The laser is directed at the Tin layer 4 in target areas to ablate portions of the copper 3 and dielectric 2 layers underneath.

After the target area has been drilled any remaining Tin 4 is removed from the entire copper surface 3 using a suitable Tin cleaning Liquid, such as Shirley's LR-2000.

Figure 2:
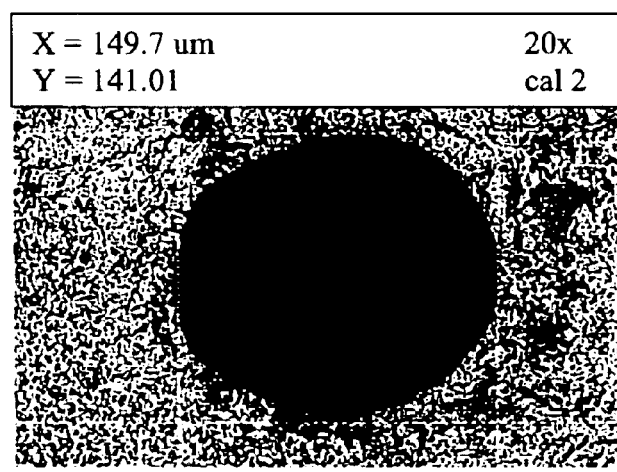
FIGS. 2 to 4 illustrate the affect of a $CO_2$ laser on the circuit board with an ablation layer.
Figure 3:
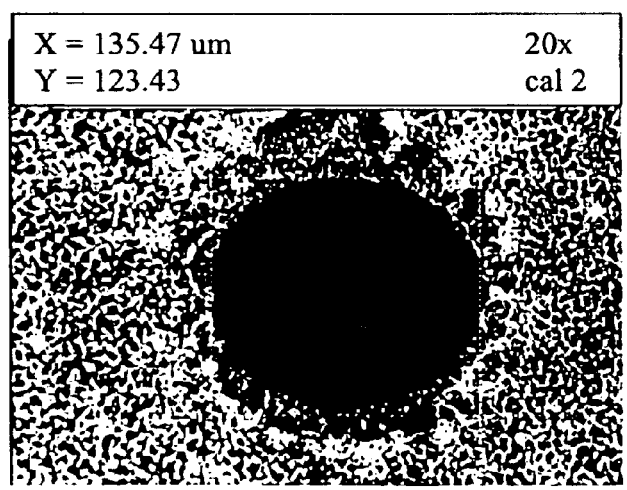
Figure 4:
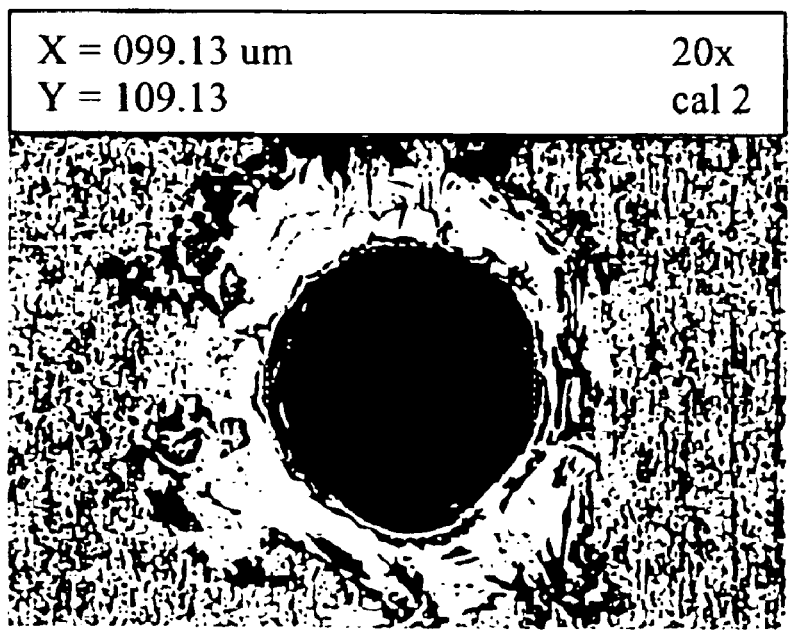

The results of laser drilling using various pulse energy densities are illustrated in FIGS. 2, 3 and 4. The laser spot target area (hole size) is 150 micrometers in diameter. The laser pulse energy density for FIG. 2 was 124 $J/cm^2$. The laser pulse energy density for FIG. 3 was 105 $J/cm^2$. The laser pulse energy density for FIG. 4 was 88 $J/cm^2$.

Figure 5:
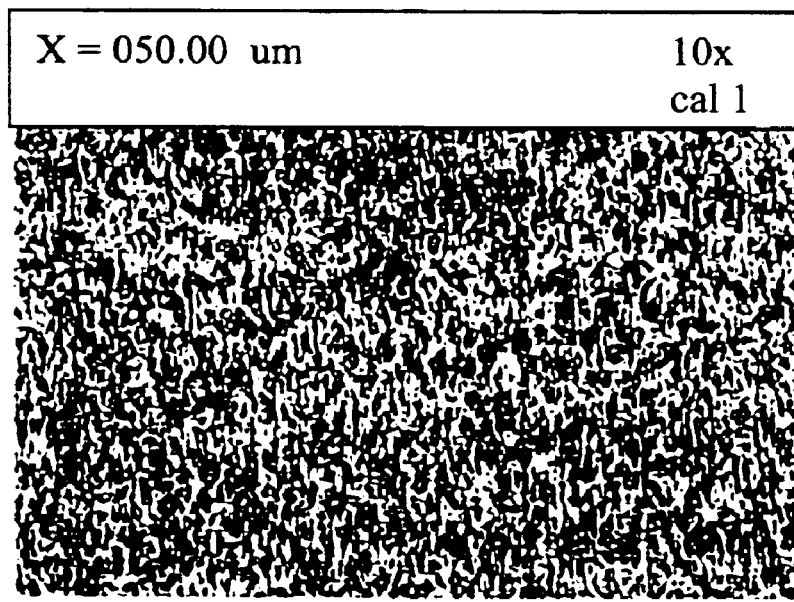
FIG. 5 illustrates the affect of a $CO_2$ laser on a circuit board without an ablation layer.

FIG. 5 illustrates an attempt to drill a circuit board without a Tin layer 4 using a 141 $J/cm^2$ energy density and laser spot target area was 150 micrometers in diameter. The laser had no visible effect on the copper surface.

Figure 6:
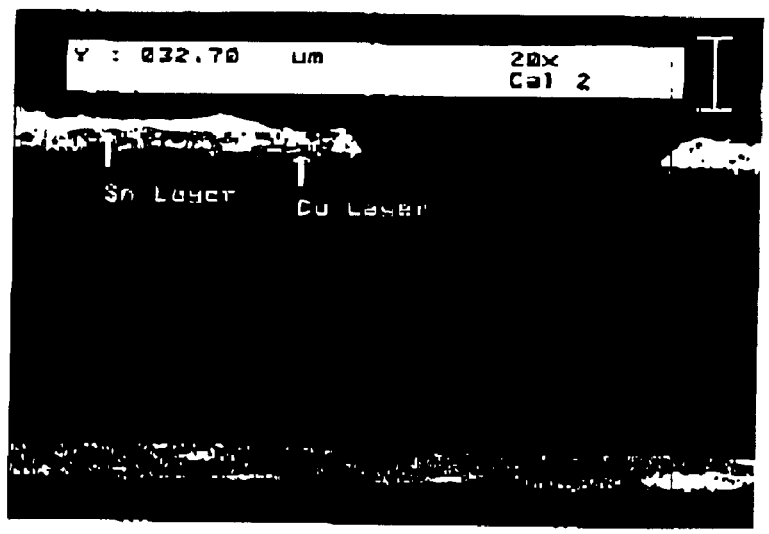
FIGS. 6 and 7 illustrate a cross section through a hole drilled according to a method of the invention.
Figure 7:
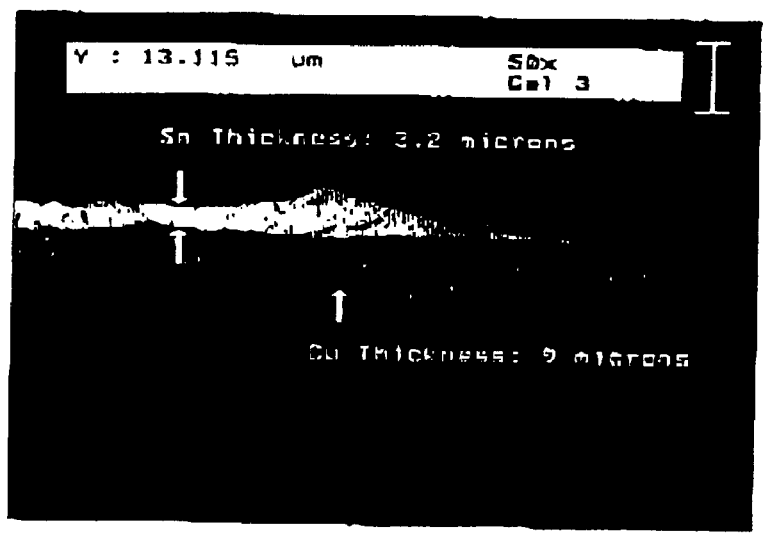

FIGS. 6 and 7 are cross-sections through a 150-micrometer hole drilled using a laser pulse energy density of 141 $J/cm^2$ with Tin layer 4. The energy density successfully made a hole under the copper layer 3.

Where in the foregoing description reference has been made to integers or elements having known equivalents then such are included as if individually set forth herein.

An example of the invention has been described, however it is understood that variations, improvements or modifications can take place without departure from the spirit of the invention or scope of the appended claims.

What is claimed is:

1. A method of drilling a circuit board comprising a dielectric material provided with a conductive layer having an ablation threshold, and in which the laser is operated at an energy density below the ablation threshold, the method including:

providing on the conductive layer a ablation layer having an ablation threshold near or below that laser energy density, directing the laser at a target area of the ablation layer to ablate portions of the conductive and dielectric layers in the target area, and removing any remaining ablation layer from the conductive layer.

2. The method of claim 1 in which the laser is a CO2 laser operated at a wavelength of 9 to 11 micrometers.

3. The method of claim 1 in which the ablation layer is metal.

4. The method of claim 1 in which the ablation layer is Tin.

5. The method of claim 1 in which the ablation layer is 3 micrometers thick.

6. The method of claim 1 in which the ablation layer is provided on the conductive layer by electroplating.

7. A method of drilling a circuit board using a CO2 laser operating at a wavelength of between 9 to 11 micrometers, in which the circuit board comprises a dielectric material provided with a copper layer, the method including:

providing a metal layer on the copper layer, directing the laser at a target area of the metal layer to ablate portions of the copper and dielectric layers in the target area, and removing any remaining metal layer from the copper layer.

8. The method of claim 7 in which the metal layer is Tin.

9. The method of claim 7 in which the metal layer is 3 micrometers thick.

10. The method of claim 7 in which the metal layer is provided on the conductive layer by electroplating.

\* \* \* \* \*